(12) United States Patent
Wu et al.

(10) Patent No.: US 11,018,452 B2
(45) Date of Patent: May 25, 2021

(54) POSITIONING FASTENER

(71) Applicant: HANWIT PRECISION INDUSTRIES LTD., New Taipei (TW)

(72) Inventors: Ming-De Wu, New Taipei (TW); Ching-Kai Chang, New Taipei (TW)

(73) Assignee: HANWIT PRECISION INDUSTRIES LTD., New Taipei (TW)

( * ) Notice: Subject to any disclaimer, the term of this patent is extended or adjusted under 35 U.S.C. 154(b) by 63 days.

(21) Appl. No.: 16/580,359

(22) Filed: Sep. 24, 2019

(65) Prior Publication Data
US 2020/0244008 A1 Jul. 30, 2020

(30) Foreign Application Priority Data
Jan. 28, 2019 (TW) ................................. 108103114

(51) Int. Cl.
| | |
|---|---|
| *H05K 3/00* | (2006.01) |
| *H05K 3/30* | (2006.01) |
| *H05K 7/14* | (2006.01) |
| *H01R 12/73* | (2011.01) |
| *H01R 12/79* | (2011.01) |
| *B25B 1/00* | (2006.01) |
| *B25B 1/24* | (2006.01) |
| *B25B 11/00* | (2006.01) |

(Continued)

(52) U.S. Cl.
CPC ............. *H01R 13/639* (2013.01); *F16B 2/06* (2013.01); *H01R 12/73* (2013.01); *H05K 1/144* (2013.01); *H05K 2201/042* (2013.01); *H05K 2201/09163* (2013.01); *H05K 2201/10393* (2013.01)

(58) Field of Classification Search
CPC ............ H05K 3/00; H05K 3/061; H05K 3/30; H05K 3/301; H05K 3/361; H05K 7/14; H05K 7/142; H05K 7/1404; H01R 12/73; H01R 12/79; B25B 1/00; B25B 1/24; B25B 1/2421; B25B 11/00
USPC .............. 361/748; 439/65, 66, 67, 331, 567; 174/70 R, 138 D, 138 G; 269/70 R, 269/138 D, 138 G
See application file for complete search history.

(56) References Cited

U.S. PATENT DOCUMENTS 5,984,293 A * 11/1999 Abrahamson .......... B23Q 1/035
269/236
6,235,991 B1 * 5/2001 Johnson ............... H05K 3/0061
174/138 D (Continued)

*Primary Examiner* — Xiaoliang Chen
(74) *Attorney, Agent, or Firm* — Muncy, Geissler, Olds & Lowe, P.C.

(57) ABSTRACT

A positioning fastener includes a base having a seat plate extended therefrom, a fixing portion disposed below the base for fastening to an electronic substrate, and an elastic positioning structure disposed above the base and including an urging plate, a pressing plate connected to the urging plate, a positioning space defined therein and a positioning member disposed at a bottom side thereof. The urging plate and the pressing plate are squeezed backwards and elastically deformed by a circuit board that is rotated downward so that the circuit board passes the urging plate and moves into the positioning space of the elastic positioning structure and a suspended board edge of the circuit board is secured in position by the positioning member. The pressing plate can be pressed by an external force to lift the urging plate, allowing the circuit board to be rotated in direction away from the positioning member.

10 Claims, 10 Drawing Sheets

(51) Int. Cl.
*H01R 13/639* (2006.01)
*H05K 1/14* (2006.01)
*F16B 2/06* (2006.01)

(56) References Cited

U.S. PATENT DOCUMENTS

| | | | |
|---|---|---|---|
| 6,790,048 B2 * | 9/2004 | Goodwin | H01R 12/52 439/331 |
| 2004/0053529 A1 * | 3/2004 | Kato | H05K 3/301 439/567 |
| 2012/0270421 A1 * | 10/2012 | Sun | H05K 3/361 439/66 |

* cited by examiner

POSITIONING FASTENER

This application claims the priority benefit of Taiwan patent application number 108103114, filed on Jan. 28, 2019.

BACKGROUND OF THE INVENTION

1. Field of the Invention

The present invention relates to fastening devices and, more particularly to a positioning fastener for detachably and rapidly securing a circuit board or interface card in position.

2. Description of the Related Art

General mobile electronic devices (such as notebook computers) are limited by the small internal space, which makes it impossible to configure the components as a personal computer. In particular, the setting space of the motherboard and related components formed in the casing of the C and D sides of the notebook computer is limited by the thickness, and the motherboard and the interface card cannot be assembled vertically in the personal computer. Therefore, the internal motherboard and interface card of the notebook computer must be assembled horizontally through a steering connector. When one end of the interface card is inserted into the steering connector, the other end of the interface card is suspended, and the suspended end of the interface card is usually locked and positioned in the motherboard through a screw to form a stable and non-sloshing state. However, the screw locking structure is not conducive to the removal of the interface card. When the metal material screw is accidentally dropped on the motherboard during the disassembly process or by external vibration, it may cause short circuit of the motherboard, which may cause damage to the electronic components. Therefore, this problem needs to be solved by research and development in this industry.

SUMMARY OF THE INVENTION

The present invention has been accomplished under the circumstances in view. It is therefore the main object of the present invention to provide a positioning fastener, which comprises a base having a seat plate extended therefrom, a fixing portion disposed below the base for fastening to an electronic substrate, and an elastic positioning structure, which is disposed above the base, comprising an urging plate, a pressing plate connected to the urging plate, a positioning space defined therein and a positioning member disposed at a bottom side thereof. The urging plate and the pressing plate are squeezed backwards and elastically deformed by a circuit board that is rotated downward so that the circuit board passes the urging plate and moves into the positioning space of the elastic positioning structure and a suspended board edge of the circuit board is secured in position by the positioning member. The pressing plate can be pressed by an external force to lift the urging plate, allowing the circuit board to be rotated in direction away from the positioning member. By the foregoing composition, a detachable structure for rapidly positioning a circuit board or interface card is formed. Further, the positioning fastener is formed of an insulating elastic material. When the positioning fastener is accidentally dropped on the electronic substrate or the circuit board, it will not cause short circuit or electronic component damage. Therefore, the positioning fastener has excellent safety.

It is another object of the present invention to provide a positioning fastener, wherein the seat plate of the base comprises a first positioning block that has a first protrusion disposed at the top side of the seat plate and a second protrusion disposed at the bottom side of the seat plate; the pressing plate comprises a second positioning block disposed at a bottom side thereof; an elastic member is mounted between the second positioning block and the first protrusion of the first positioning block; the seat plate and the pressing plate define therebetween an elastic space.

It is still another object of the present invention to provide a positioning fastener, wherein the elastic positioning structure further comprises an elastic plate; the urging plate, the pressing plate, the elastic plate and the positioning member are connected together; the pressing plate is disposed in the same plane as the urging plate; the elastic plate has one end thereof connected to a bottom wall of the pressing plate and an opposing end thereof connected to a top side of the base; the positioning member is connected to the elastic plate above the electronic substrate.

It is still another object of the present invention to provide a positioning fastener, wherein the urging plate comprises a pushing surface that is an arc surface forcible by the circuit board to squeeze the urging plate backwards when the circuit board is rotated and moved into the positioning space of the elastic positioning structure.

Other and further benefits, advantages and features of the present invention will be understood by reference to the following specification in conjunction with the accompanying drawings, in which like reference characters denote like elements of structure.

DETAILED DESCRIPTION OF THE PREFERRED EMBODIMENT

Figure 1:
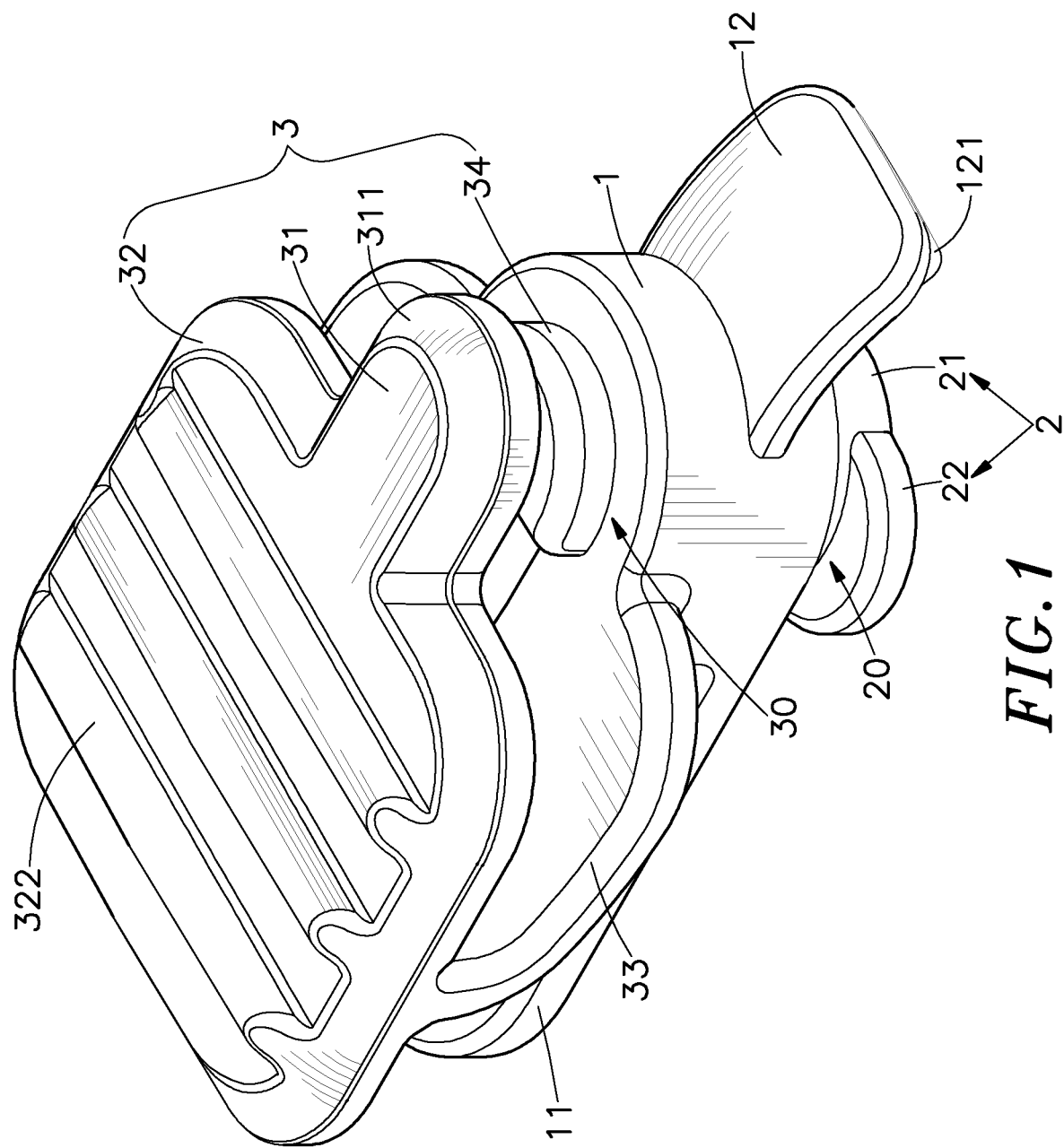
FIG. 1 is an oblique top elevational view of a positioning fastener in accordance with the present invention.
Figure 2:
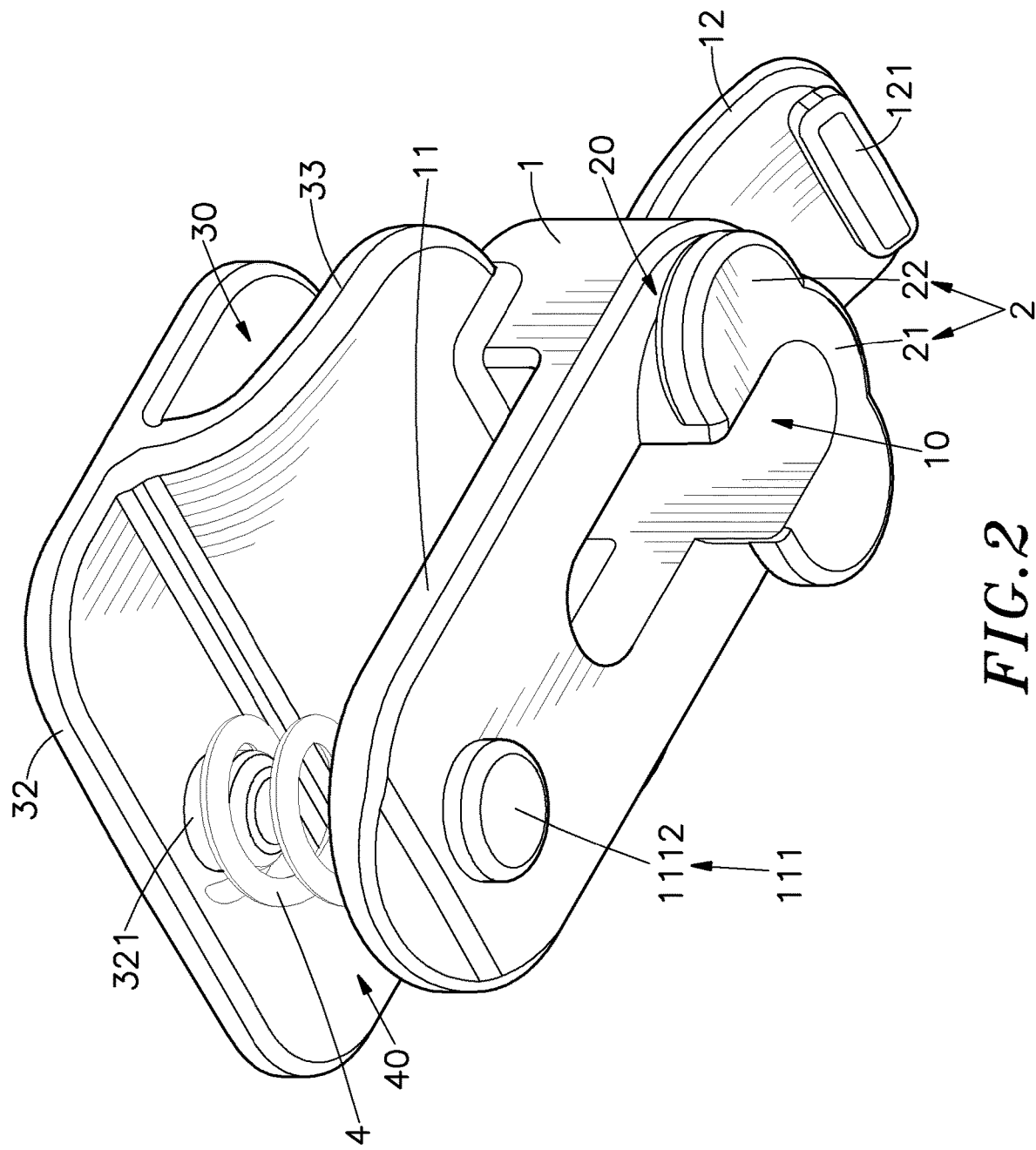
FIG. 2 is an oblique bottom elevational view of the positioning fastener in accordance with the present invention.
Figure 3:
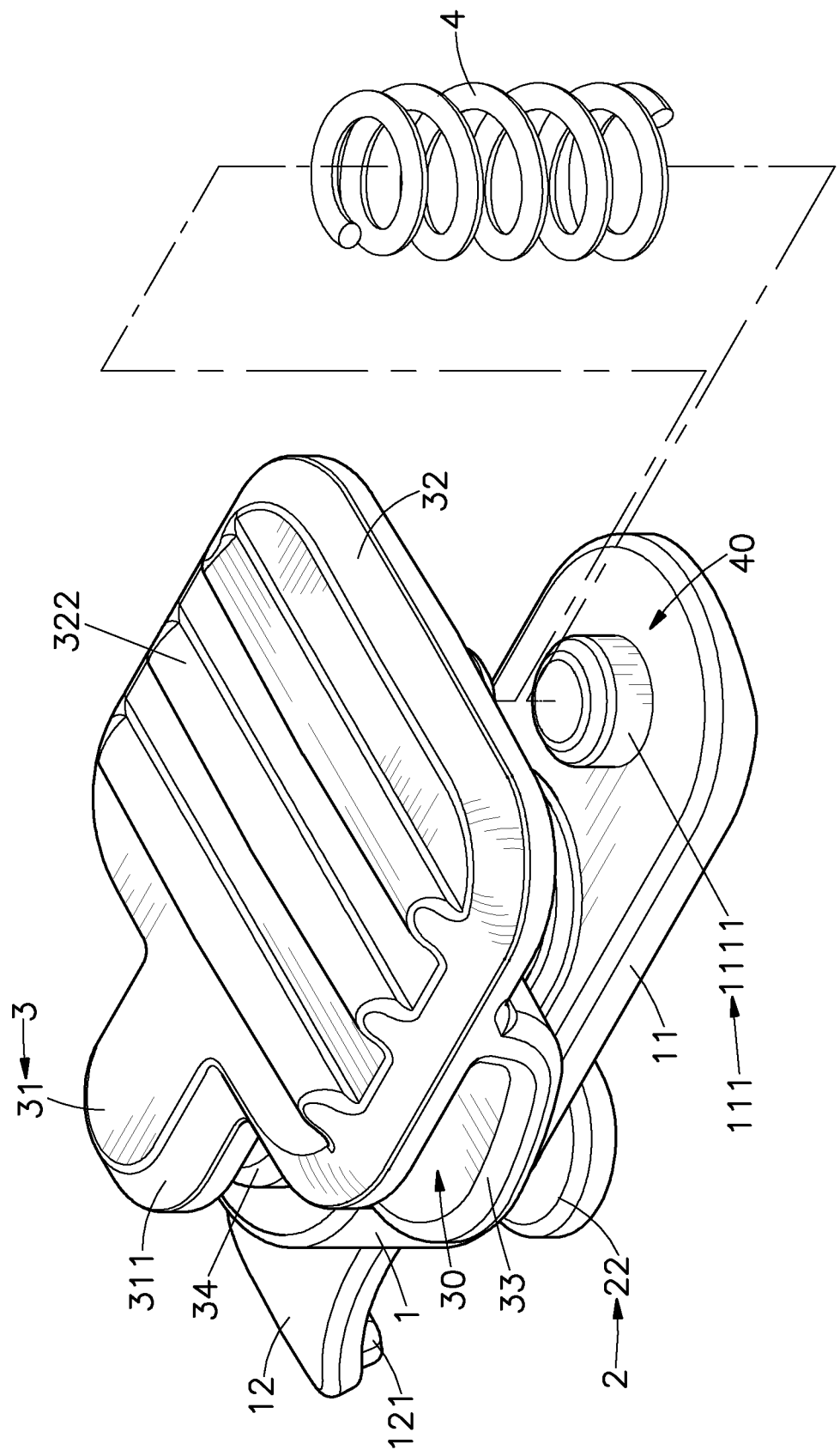
FIG. 3 is an exploded view of the is positioning fastener in accordance with the present invention.
Figure 4:
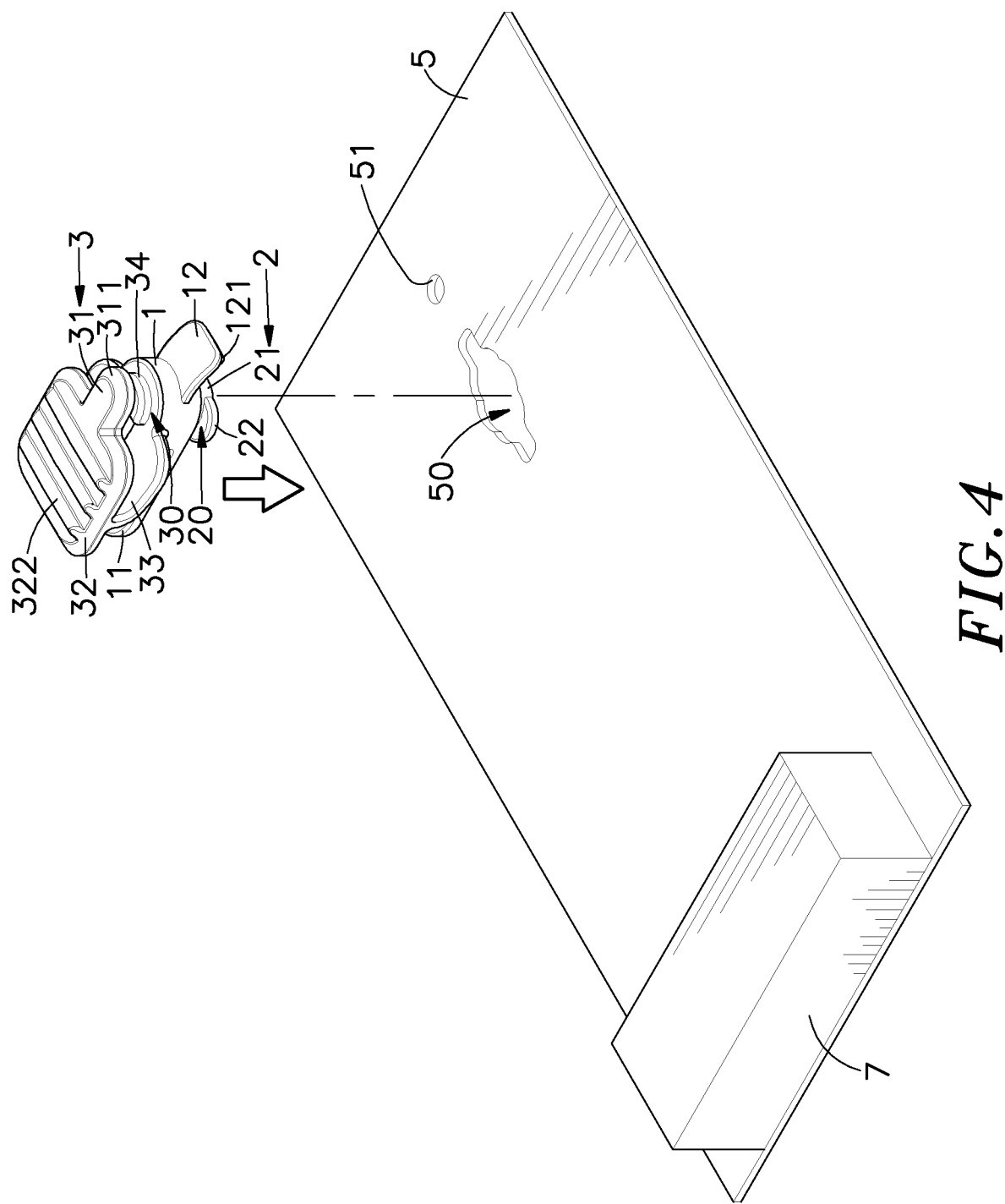
FIG. 4 is a schematic drawing illustrating the installation of the positioning fastener in the electronic substrate (I).
Figure 5:
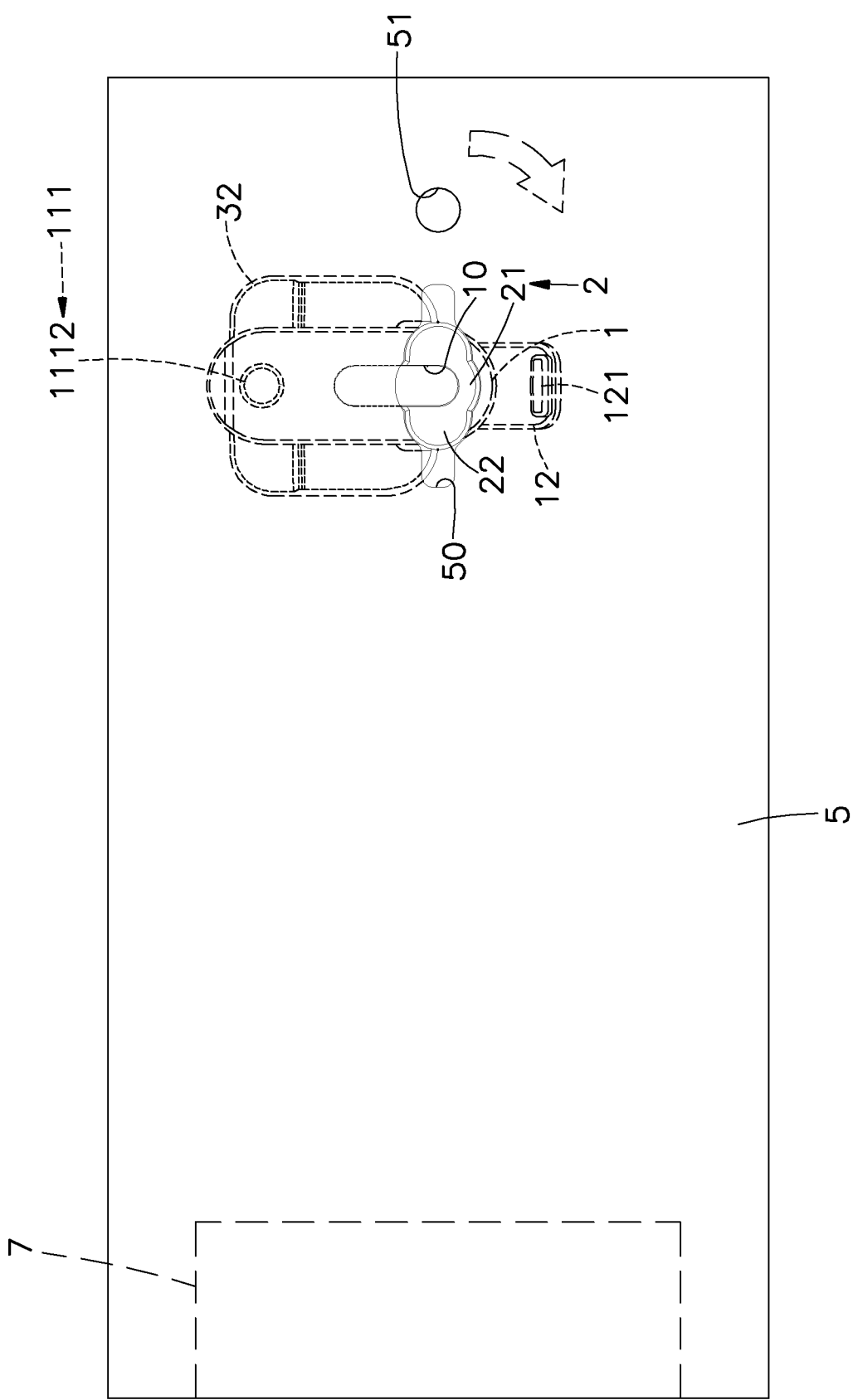
FIG. 5 is a schematic drawing illustrating the installation of the positioning fastener in the electronic substrate (II).
Figure 6:
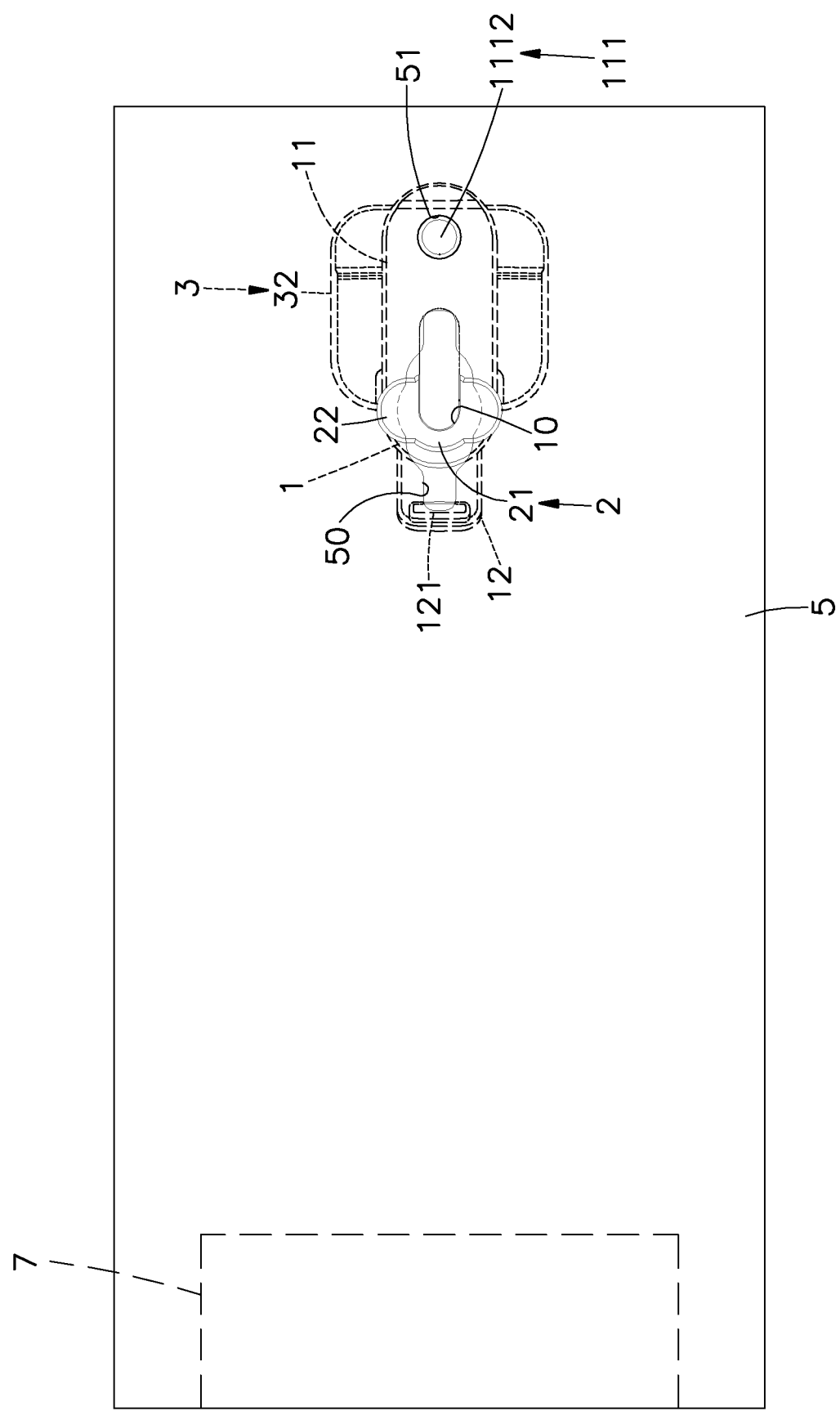
FIG. 6 is a schematic drawing illustrating the installation of the positioning fastener in the electronic substrate (III).
Figure 7:
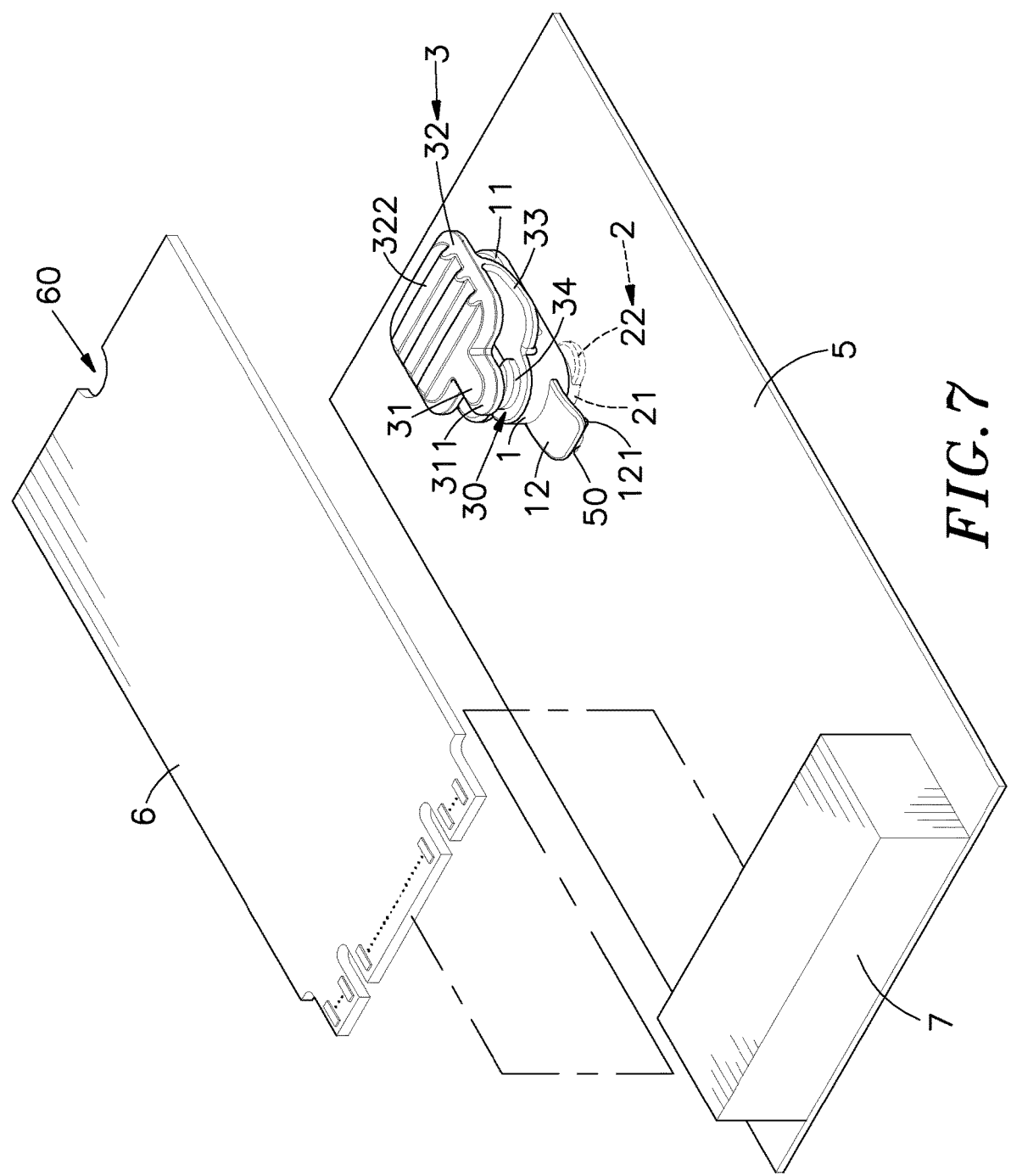
FIG. 7 is a schematic drawing of the present invention, illustrating the positioning fastener installed in the electronic substrate before installation of the circuit board.
Figure 8:
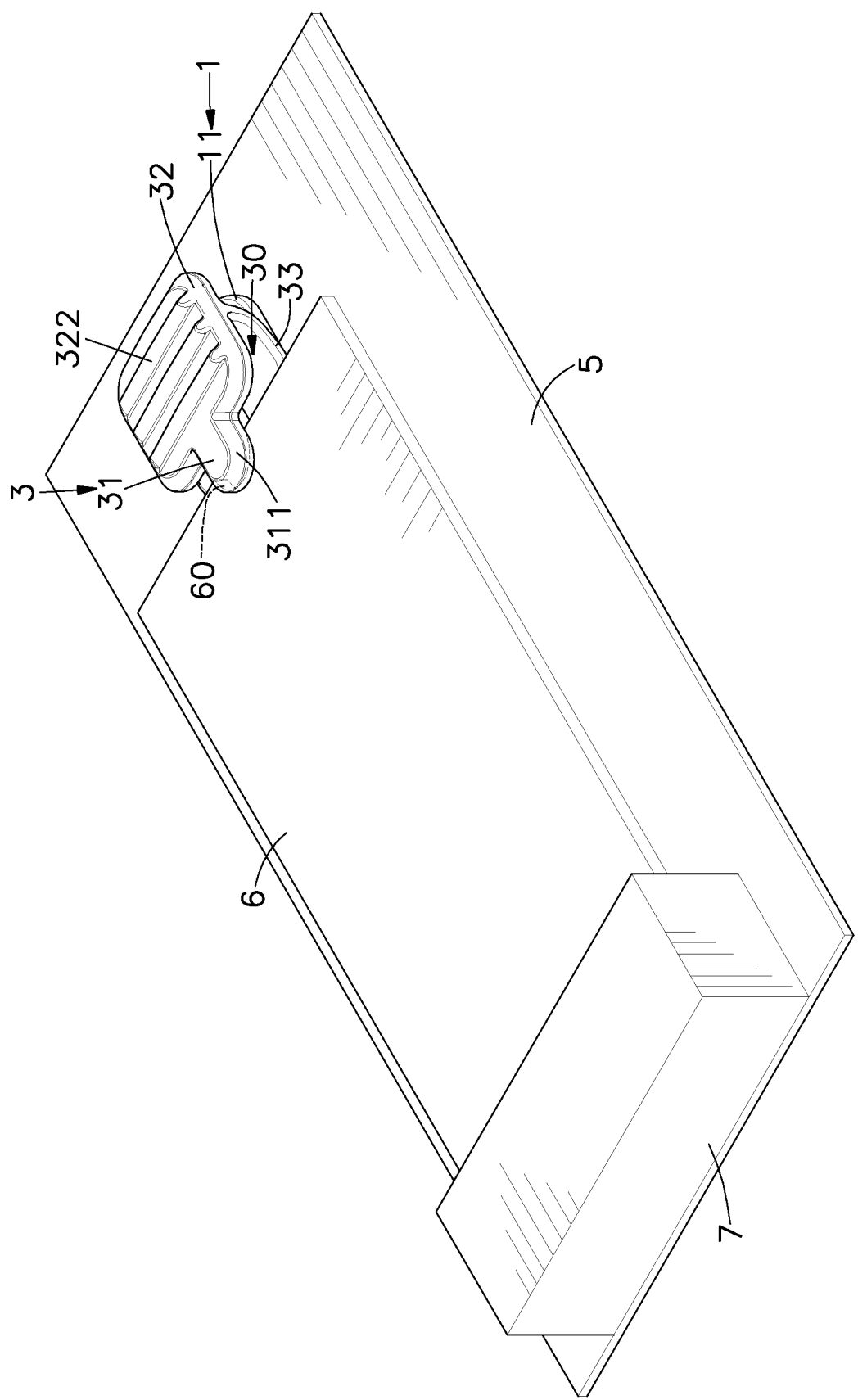
FIG. 8 corresponds to FIG. 7, illustrating the circuit board inserted into the electrical connector at the electronic substrate and secured by the positioning fastener.
Figure 9:
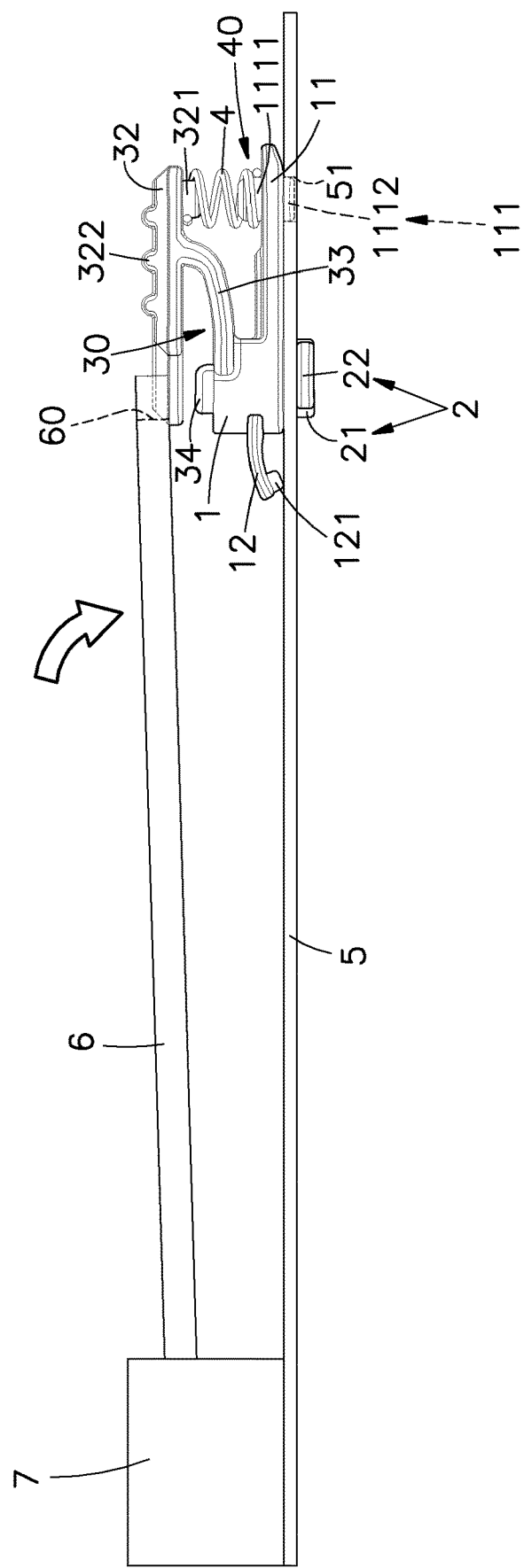
FIG. 9 is a schematic sectional side view, illustrating the suspended board edge of the circuit board biased toward the positioning member.
Figure 10:
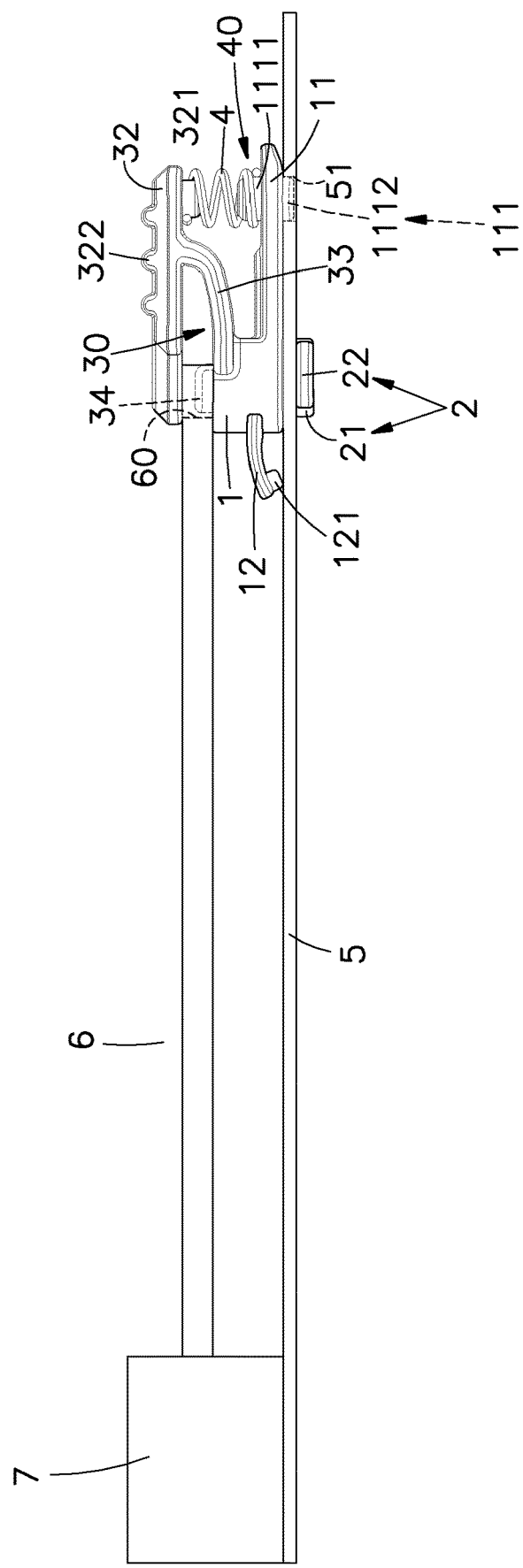
FIG. 10 corresponds to FIG. 9, illustrating the suspended board edge of the circuit board forced into abutment against the positioning member.

Referring to FIGS. 1-3, a positioning fastener in accordance with the present invention is shown. The positioning fastener is disposed on an electronic substrate 5, and the electronic substrate 5 is provided with an electrical connector 7. The electrical connector 7 is configured for the insertion of a circuit board 6 for electrical connection, and the suspended board edger of the circuit board 6 is secured in place by the positioning fastener (see also FIG. 8). The positioning fastener comprises a base 1, a fixing portion 2, an elastic positioning structure 3 and an elastic member 4. The base 1, the fixing portion 2 and the elastic positioning structure 3 are made of an insulating elastic material (for example, elastic plastic or rubber) in one piece. The main components and features of the positioning fastener are detailed below:

The base 1 comprises a seat plate 11 on one side thereof, an abutment plate 12 on an opposite side thereof, and an abutting protrusion 121 on a bottom side of the abutment plate 12 for abutting against the upper surface of the electronic substrate 5 to form a positioning structure of the positioning fastener and the electronic substrate 5.

The fixing portion 2 is disposed below the base 1 for securing to the electronic substrate 5. The fixing portion 2 is formed of a fixed column 21 and a plurality of wings 22 (in this embodiment, two wings 22 are set in the symmetric direction of the fixed column 21, however, this configuration is not a limitation). The fixed column 21 and the wings 22 are inserted through a locating hole 50 of the electronic substrate 5 and then rotated and positioned, enabling the electronic substrate 5 to be clamped between the seat plate 11 and the wings 22. The so-called rotational positioning (rotated and positioned) is to rotate the positioning fastener at a predetermined angle (the preferred implementation angle is 90°, but can also be 45°, 60°, 105°, 120° or other angles). Further, a clamping groove 20 is defined between the wings 22 and the seat plate 11 of the base 1 and used to clamp the electronic substrate 5 in position. The elastic positioning structure 3 is formed of an urging plate 31, a pressing plate 32, an elastic plate 33 and a positioning member 34. The pressing plate 32 is located in the same plane as the urging plate 31. The elastic plate 33 has one end thereof connected to a bottom wall of the pressing plate 32 and an opposite end thereof connected to a top side of the base 1. The positioning member 34 is connected to the elastic plate 33 and disposed above the electronic plate 5. The elastic positioning structure 3 is disposed above the base 1. The urging plate 31 of the elastic positioning structure 3 and the pressing plate 32 connected to the urging plate 31 are preset by the circuit board 6 (for example, M2 circuit board, SATA storage interface card). The circuit board 6 is rotated downward and pressed to deform the urging plate 31 and the pressing plate 32 so that the circuit board 6 enters a positioning space 30 of the elastic positioning structure 3 through the urging plate 31. Further detailing the positioning action: The urging plate 31 has a pushing surface 311 which is an arc surface. The circuit board 6 is rotated to the pushing surface 311 to deform the urging plate 31 backwards so that the circuit board 6 can enter the positioning space 30 of the elastic positioning structure 3 smoothly. The positioning member 34 at the bottom side of the elastic positioning structure 3 is a semi-circular plate. The circuit board 6 is provided with a semi-circular buckle groove 60. The positioning member 34 is positioned in the semi-circular buckle groove 60 on the suspended side of the circuit board 6 to form a positioning structure of the positioning fastener and the circuit board 6. When the circuit board 6 is to be removed, pressing the end of the pressing plate 32 causes the urging plate 31 to tilt up, and the circuit board 6 is rotated away from the positioning member 34.

The seat plate 11 of the base 1 comprises a first positioning block 111. The first positioning block 111 has a first protrusion 1111 disposed at the top side of the seat plate 11 and a second protrusion 1112 disposed at the bottom side of the seat plate 11. The pressing plate 32 comprises a second positioning block 321. The elastic member 4 is mounted between the second positioning block 321 and the first protrusion 1111 of the first positioning block 111. The elastic member 4 is arranged to avoid fracture of the elastic plate 33 due to excessive stress when a force is applied to the pressing plate 32. Further, an elastic space 40 is formed between the seat plate 11 and the pressing plate 32. The second protrusion 1112 of the seat plate 11 is correspondingly engaged with a fixing hole 51 of the electronic substrate 5 to form a positioning structure of the positioning fastener and the electronic substrate 5. The abutting protrusion 121 of the abutment plate 12 of the positioning fastener, the fixing portion 2 and the second protrusion 1112 of the seat plate 11 are simultaneously positioned or resisted by the electronic substrate 5 to form a stable structure of three points in a straight line. The upper surface of the pressing plate 32 is provided with a corrugated structure 322 for increasing the friction with the user's hand for the user to press.

Since the positioning fastener is integrally formed, it is only necessary to assemble the elastic member 4 between the second positioning block 321 and the first protrusion 1111 of the first positioning block 111, and the assembly method is convenient and helpful to rapid mass production of the positioning fastener of the present invention.

Referring to FIGS. 4-10, to assemble the positioning fastener to the electronic substrate 5, first insert the fixed column 21 and the wings 22 into the locating hole 50 of the electronic substrate 5 and then rotate the positioning fastener clockwise or counterclockwise through 90° relative to the electronic substrate 5 to make a positioning. At this time, the electronic substrate 5 is sandwiched between the seat plate 11 and the wings 22, the second protrusion 1112 of the seat plate 11 is engaged in the fixing hole 51 of the electronic substrate 5, the abutting protrusion 121 of the abutment plate 12 is abutted against the upper surface of the electronic substrate 5, and the clamping groove 20 of the fixing portion 2 clamps the electronic substrate 5 to form a fixed state of three-point in a straight line. The electrical connector 7 at the electronic substrate 5 is provided for the insertion and electrical connection of the circuit board 6, and the suspended board edge of the circuit board 6 is secured in placed by the positioning fastener. When the suspended board edge of the circuit board 6 is to be positioned in the positioning fastener, the electrical connector 7 is first used as the rotation axis to rotate the circuit board 6 toward the urging plate 31 of the positioning fastener. At this time, the pressing plate 32 and the elastic plate 33 are deformed backwards by the downward rotation and the pushing stress of the circuit board 6, and the elastic member 4 is elongated and deformed, so that the circuit board 6 passes the urging plate 31 and moves along the pushing surface 311 into the positioning space 30 of elastic positioning structure 3. Thus, the positioning member 34 of the positioning space 30 is forced into engagement with the semi-circular buckle groove 60 of the circuit board 6, and the urging plate 31, the pressing plate 32, the elastic plate 33 and the elastic member 4 are returned to their former position to form the positioning structure of the positioning fastener and the circuit board 6.

According to the above, when the circuit board 6 is to be removed, press the end of the pressing plate 32 to lift the urging plate 31 and to deform the elastic plate 32, causing the elastic member 4 to be compressed and deformed. Then, rotate the circuit board 6 away from the positioning member 34, then release the pressure from the pressing plate 32, allowing the elastic member 4 to rebound to the state before compression, and thus, the urging plate 31, the pressing plate 32 and the elastic plate 33 return to the original position to complete the use of the present invention.

As disclosed in FIGS. 1-10, the present invention provides a positioning fastener, which comprises a base having a seat plate extended therefrom, a fixing portion disposed below the base for fastening to an electronic substrate, and an elastic positioning structure disposed above the base. An urging plate of the elastic positioning structure and a pressing plate connected to the urging plate are squeezed backwards and deformed by a circuit board that is rotated downwards, allowing the circuit board to pass the urging plate and to move into a positioning space of the elastic positioning structure. The elastic positioning structure has a positioning member at the bottom side thereof. The positioning member is abutted against the suspended board edge of the circuit board for positioning. When the circuit board is to be removed, press the end of the pressing plate to lift the urging plate, and then the circuit board is rotated away from the positioning member. By the foregoing composition, a detachable structure for rapidly positioning a circuit board or interface card is formed. Further, the positioning fastener is formed of an insulating elastic material. When the positioning fastener is accidentally dropped on the electronic substrate or the circuit board, it will not cause short circuit or electronic component damage. It has excellent safety and is extremely practical for assembly of electronic products. Therefore, a patent application is filed to seek protection of patent rights.

What the invention claimed is:

1. A positioning fastener, comprising:
a base having a seat plate extended therefrom;
a fixing portion disposed below said base for fastening to an electronic substrate; and
an elastic positioning structure disposed above said base, said elastic positioning structure comprising an urging plate, a pressing plate connected to said urging plate, a positioning space defined therein and a positioning member disposed at a bottom side thereof, said urging plate and said pressing plate being squeezed backwards and elastically deformed by a circuit board that is rotated downward so that said circuit board passes said urging plate and moves into said positioning space of said elastic positioning structure and a suspended board edge of said circuit board is secured in position by said positioning member, said pressing plate being pressible by an external force to lift said urging plate for allowing said circuit board to be rotated in direction away from said positioning member.

2. The positioning fastener as claimed in claim 1, wherein said fixing portion is formed of a fixed column and a plurality of wings, said fixed column and said wings being inserted through a locating hole of said electronic substrate and secured to said electronic substrate through a rotary motion; the positioning fastener further comprises a clamping groove defined between said wings and said seat plate of said base and used to clamp said electronic substrate in position.

3. The positioning fastener as claimed in claim 1, wherein said seat plate of said base comprises a first positioning block, said first positioning block comprising a first protrusion disposed at a top side of said seat plate and a second protrusion disposed at a bottom side of said seat plate; said pressing plate comprises a second positioning block disposed at a bottom side thereof; the positioning fastener further comprises an elastic member mounted between said second positioning block and said first protrusion of said first positioning block; said seat plate and said pressing plate define therebetween an elastic space.

4. The positioning fastener as claimed in claim 3, wherein said second protrusion of said seat plate is engaged in a fixing hole of an electronic substrate to form a positioning structure of the positioning fastener and said electronic substrate.

5. The positioning fastener as claimed in claim 1, wherein said elastic positioning structure further comprises an elastic plate, said urging plate, said pressing plate, said elastic plate and said positioning member being connected together, said pressing plate being disposed in the same plane as said urging plate, said elastic plate having one end thereof connected to a bottom wall of said pressing plate and an opposing end thereof connected to a top side of said base, said positioning member being connected to said elastic plate above said electronic substrate.

6. The positioning fastener as claimed in claim 1, wherein said urging plate comprises a pushing surface that is an arc surface forcible by said circuit board to squeeze said urging plate backwards when said circuit board is rotated and moved into said positioning space of said elastic positioning structure.

7. The positioning fastener as claimed in claim 1, wherein said base further comprises an abutment plate disposed opposite to said seat plate, said abutment plate comprising an abutting protrusion located on a bottom side thereof and adapted for abutting against a top surface of said base to form a positioning structure of said positioning fastener and said electronic substrate.

8. The positioning fastener as claimed in claim 1, which is made in one piece.

9. The positioning fastener as claimed in claim 1, wherein said pressing plate comprises a corrugated structure formed on an upper surface thereof for increasing the friction with the user's hand for the user to press.

10. The positioning fastener as claimed in claim 1, wherein said positioning member is a semi-circular plate for engagement with a semi-circular buckle groove on said circuit board to form a positioning structure of said positioning fastener and said circuit board.

* * * * *